United States Patent [19]

Engeler

[11] 3,890,635

[45] June 17, 1975

[54] VARIABLE CAPACITANCE SEMICONDUCTOR DEVICES

[75] Inventor: William E. Engeler, Scotia, N.Y.

[73] Assignee: General Electric Company, Schenectady, N.Y.

[22] Filed: Dec. 26, 1973

[21] Appl. No.: 428,418

[52] U.S. Cl. .................... 357/14; 357/23; 357/24

[51] Int. Cl. .................... H01l 17/00

[58] Field of Search ........ 317/234, 235; 357/14, 23, 357/24

[56] References Cited

UNITED STATES PATENTS

| | | | |
|---|---|---|---|
| 3,439,236 | 4/1969 | Blicher | 317/235 |
| 3,455,020 | 7/1969 | Dawson et al. | 317/235 |
| 3,564,355 | 2/1971 | Lehovec | 317/235 |
| 3,633,078 | 1/1972 | Dill | 317/235 |
| 3,735,156 | 5/1973 | Krambeck et al. | 317/235 |
| 3,808,472 | 4/1974 | Engeler | 317/234 |

*Primary Examiner*—Michael J. Lynch
*Assistant Examiner*—E. Wojciechowicz
*Attorney, Agent, or Firm*—Julius J. Zaskalicky; Joseph T. Cohen; Jerome C. Squillaro

[57] ABSTRACT

A high frequency CIS capacitance device having a substrate of one conductivity type provides a pair of values of capacitance for a high frequency signal applied across a pair of capacitance electrodes thereof. One of the values of capacitance is dependent on applying a control potential on a control electrode to the surface adjacent region underlying one of the capacitance electrodes through a channel region of opposite conductivity and greater in magnitude than the surface potential of the surface adjacent region to drain the surface adjacent region of charge carriers therein. Means are provided for alternatively establishing the channel region to produce one value of capacitance corresponding to depletion of charge carrriers from the surface adjacent region or another value of capacitance corresponding to establishing another value of surface potential in this surface adjacent region by other means. Such other means may be by applying another control potential through another channel region of opposite conductivity or by generation of charge carriers within the substrate. Composite devices are formed of elemental devices such as described in which the capacitance of the composite device is the sum of the capacitance of the elemental devices and is variable in discrete increments to provide a large number of discrete values of capacitance in response to digital signals applied to a minimum number of control electrodes connected thereto.

18 Claims, 17 Drawing Figures

VARIABLE CAPACITANCE SEMICONDUCTOR DEVICES

The present invention relates in general to CIS (conductor-insulator-semiconductor) capacitance devices and in particular relates to such devices in which the capacitance provided thereby is variable in discrete increments.

In patent application Ser. No. 319,324, filed Dec. 29, 1972, now U.S. Pat. No. 3,808,472, and assigned to the assignee of the present invention, there is disclosed a high frequency CIS capacitance device for providing a capacitance for a high frequency signal applied across a pair of electrodes thereof which is dependent on a voltage applied to a control electrode connected to a surface adjacent region underlying one of the pair of electrodes of the device through a first channel region of opposite conductivity type. In patent application Ser. No. 428,394, filed Dec. 26, 1973 and also assigned to the assignee of the present invention, there is disclosed a high frequency CIS capacitance device, such as described in the aforementioned patent application, in which an additional control electrode is provided and means for connecting the additional control electrode to the surface adjacent region through a second channel region of opposite conductivity type. Another voltage corresponding to another value of capacitance of the device is applied to the second control electrode. Further means are provided for alternatively establishing the first and second channel regions to establish one or the other value of capacitance of the device. Patent application Ser. No. 428,394 also discloses composite devices formed of elemental devices such as described in which the capacitance of the composite device is variable in discrete increments to provide a large number of discrete values of capacitance in response to digital signals applied to a number of controlled electrodes connected thereto.

The present invention is directed to providing improvements in individual capacitance devices such as described above as well as to providing composite capacitance devices in which the number of capacitance controlling electrodes and correspondingly the signals applied thereto to provide a given number of discrete values of capacitance are reduced in number over the number required in the aforementioned patent application Ser. No. 428,394.

The aforementioned patent applications Ser. No. 319,324 and Ser. No. 428,394 are incorporated herein by reference there to.

An object of the present invention is to provide variable capacitance semiconductor devices for operation at high frequencies.

Another object of the present invention is to provide a variable capacitance semiconductor device which provides a large number of discrete values of capacitance in response to digital signal applied to a minimum number of control electrodes connected thereto.

Another object of the present invention is to provide a variable capacitance semiconductor device electrically controllable to provide a large number of discrete values of capacitance from a minimum to a maximum value of capacitance in which the minimum capacitance and the maximum capacitance can be accurately and reliably set and in which the increments of the capacitance between successive values of capacitance can also be accurately and reliably set thereby.

Another object of the present invention is to provide a voltage variable capacitance semiconductor device providing a capacitance which is relatively simple in construction and highly reliable in operation.

In carrying out the invention in one illustrative embodiment thereof, there is provided a substrate of semiconductor material of one type conductivity having a plurality of capacitance providing electrodes. Each of the capacitance providing electrodes is spaced a predetermined distance from a respective surfacce adjacent region of the substrate and forms with respect to a common electrode connected to the substrate a capacitor. Each surface adjacent region is spaced from the other surface adjacent regions sufficiently to permit a separate surface potential to be established therein. The capacitance providing electrodes are connected together to provide a common capacitance providing electrode of the device. This connection preferably has negligible impedance at the operating frequency so that all of the respective elemental capacitances behave as a single capacitive element. To this end, it is desirable that the capacitance providing electrodes be located as close together as possible on the substrate subject to the requirement that the respective surface potentials of the respective surface adjacent regions can be independently controlled. Means are provided for applying a depletion producing voltage between the common capacitance providing electrode and the common electrode to bias the surface adjacent regions to a predetermined surface potential. The predetermined surface potential has an absolute value less than the absolute value of the depletion producing voltage and greater than the inversion threshold surface potential of the capacitors. Means are also provided for applying a high frequency signal between the common capacitance providing electrode and the common electrode. Control means are provided for establishing individually in each of the surface adjacent regions a first potential in relation to the substrate corresponding to a low value of capacitance between the respective capacitance providing electrode and the common electrode and for establishing alternatively and individually in each of the surface adjacent regions a second potential in relation to the substance corresponding to a high value of capacitance between a respective capacitance providing electrode and the common electrode. The control means includes a first control electrode, channel establishing means for individually establishing a plurality of first channel regions of opposite type conductivity in the substrate, each first channel region connected between a respective surface adjacent region and the first control electrode, and means for applying a first control potential to the first control electrode greater in magnitude than the predetermined surface potential whereby each surface adjacent region is drained of charge carriers therein when a respective first channel is established. The capacitance of the device is variable in increments dependent on the particular potentials established in the surface adjacent regions of the capacitors from a minimum value corresponding to the sum of the low value capacitances of the capacitors when the first potential is established in all of the surface adjacent regions of the capacitors to a maximum value corresponding to the sum of the high value capacitances of the capacitors when the second potential is established in all of the surface adjacent regions of the capacitors.

The novel features which are believed to be characteristic of the present invention are set forth with particularity in the appended claims. The invention itself, both as to its organization and method of operation together with further objects and advantages thereof, may best be understood with reference to the following description taken in connection with the accompanying drawings wherein FIG. 1 shows a plan view of a semiconductor device including means for controlling the capacitance thereof to provide a low value capacitance when one set of control voltages is applied thereto and for providing a high value capacitance when another set of control voltages are applied thereto in accordance with one aspect of the present invention.

FIG. 2 shows a front elevation view in section of the semiconductor device of FIG. 1 including voltage biasing means and utilization circuits connected to the terminals of the semiconductor device.

FIG. 3 shows a family of graphs of potentials in the semiconductor device of FIGS. 1 and 2 as a function of distance normal to the surface of the semiconductor body underlying the first electrode thereof. Each graph represents the variation of potential from a most negative value at the surface to a minimum at the maximum depletion depth for respective surface potentials at the surface corresponding to particular charge densities thereat.

FIG. 4 shows a pair of graphs each illustrating the manner in which the capacitance between the electrodes of the semiconductor device of FIGS. 1 and 2 varies as a function of the d-c operating voltage applied between the first and second electrodes for a respective control voltage applied to the surface adjacent region thereof. The particular control voltages selected provide the low and high values of capacitance desired.

Figure 1:
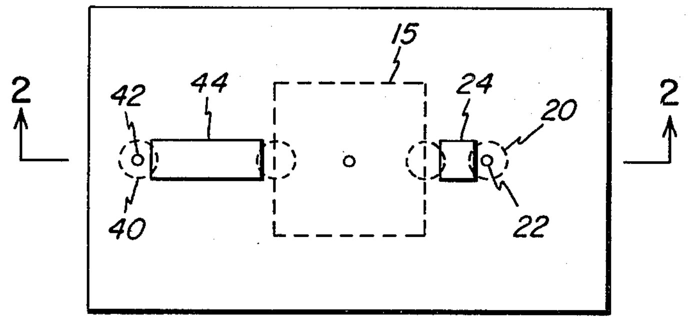
Figure 2:
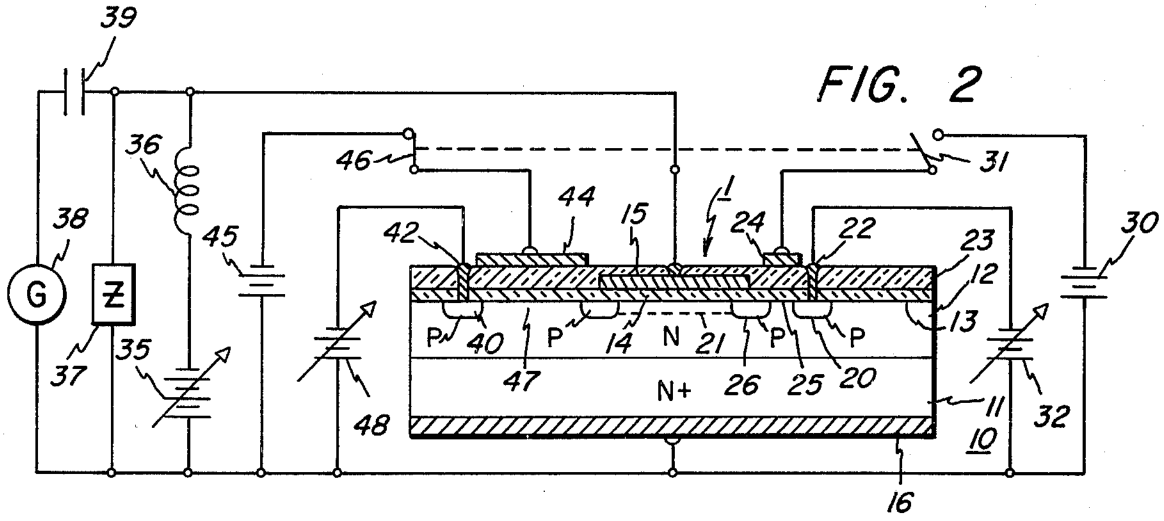

Referring now to FIGS. 1 and 2 there is shown a semiconductor device 1 and circuit connections thereto for providing a pair of discrete values of capacitance for a high frequency signal in response to a pair of capacitance controlling potentials established in the surface adjacent regions thereof. The device is particularly useful as an element in a composite semiconductor device including a plurality of such individual devices to provide a plurality of discrete values of capacitance for a high frequency signal as will be described below in connection with FIG. 11. A part of the device of FIGS. 1 and 2 is described and claimed in the aforementioned patent application Ser. No. 319,324. The device 1 includes a body or substrate 10 of semiconductor material of one conductivity type, such as N-type silicon, for example. Conveniently, the body may be constituted of a layer 11 of low resistivity silicon and a layer 12 of silicon of substantially higher resistivity epitaxially grown thereon and providing an exposed major face or surface 13. Conveniently, the substrate 11 may be 5 mils thick and the epitaxial layer 12 may be 10 microns thick. A thin layer 14 of a suitable insulating material such as silicon oxide, for example, 1000 Angstroms thick, is provided on the major exposed face 13 of the epitaxial layer. A conductive film or plate 15 of a suitable material such as molybdenum for example, is formed on the insulating layer overlying a portion of the major surface 13 of the epitaxial layer and constitutes a first or capacitance providing electrode of the device. A conductive film or plate 16 of material makes ohmic contact with the opposite face of the substrate 10 and constitutes a second electrode of the device. Capacitance of the device is provided between the first electrode 15 and second electrode 16 of the device. A region 20 of opposite conductivity type is provided adjacent the major face of the body spaced from the surface adjacent region 21 of the epitaxial layer underlying the first electrode 15. Another region 26 of opposite conductivity type is contiguous with a small portion of the periphery of the surface adjacent region 21. A third electrode 22 makes conductive connection to the region 20. A layer of insulating material 23, such as silicon dioxide, is provided over the exposed surface of the insulating layer 14 and the first film 15 of conductive material. A conductive film or plate 24, short and narrow in form, constituting a fourth and gate electrode is provide over the layer of insulation 23 insulatingly overlying the surface adjacent region 25 between region 26 and region 20 of P-type conductivity. A depletion producing voltage may be applied from source 30 and through "on-off" swtich 31 between the fourth electrode 24 and the second electrode 16 to invert the conductivity of region 25 of the semiconductor layer lying thereunder to provide a resistive channel between the surface adjacent region 21 and the third electrode 22. Another battery or source 32 of variable voltage is applied between the second electrode 16 and the third electrode 22 with the negative terminal of the source connected to the second electrode. When the depletion producing voltage of source 30 is applied a control voltage from source 32 appears at the surface adjacent region 21 corresponding to one value of capacitance. The voltage of source 32 is set to continuously drain minority charge carriers from the surface adjacent region 21 and provide a low value of capacitance as will be more fully explained in connection with FIGS. 3 and 4.

A means for producing depletion in the semiconductor layer 12 is provided in the form of a variable voltage battery 35 and a high frequency choke 36 connected in series so that the negative terminal of the battery is connected through the choke to the first electrode 15 and the positive terminal of the battery is connected to the second electrode 16. A generalized impedance 37 which may, for example, be an inductance, is connected in parallel with the capacitance appearing across the first and second electrodes to provide a tuned circuit, and a source 38 of high frequency signal is connected between the first and second electrodes through a d-c blocking capacitor 39. The potential of the source 30 is set so as to be able to produce an inversion channel of a predetermined high resistance between the surface adjacent region 21 and the region 20. When the switch 31 is closed a resistive channel is provided between the third electrode 22 and the surface adjacent region 21 and the device provides one value of capacitance to a high frequency signal in a manner to be explained below in connection with FIGS. 3 and 4.

A region 40 of opposite conductivity type is provided adjacent the major surface of the body 10 spaced from the surface adjacent region 21 underlying the first electrode 15. Another region 49 of opposite conductivity type is continuous with a small portion of the periphery of the surface adjacent region 21. A fifth electrode 42 makes conductive connection to the region 40. A conductive film or plate 44 of narrow and elongated form constituting the sixth electrode is provided over the layer of insulation 23 overlapping the edge of region 49 and also overlapping the edge of the region 40. A depletion producing voltage may be applied from source 45 and through switch 46 between the sixth electrode 44 and the second electrode 16 to invert the conductivity of region 47 of the semiconductor layer lying thereunder to provide a resistive channel between the surface region 21 and the fifth electrode 42. Voltage from variable voltage source 48 is applied between the second electrode 16 and the fifth electrode 42 with the negative terminal of the source connected to the fifth electrode and the positive terminal connected to the second electrode. When the depletion producing voltage is applied a control voltage from source 48 appears at the surface adjacent region 21 corresponding to another value of capacitance. The potential of the source 45 is set so as to be able to produce an inversion channel of a predetermined high resistance between the surface adjacent region 21 and the region 40. Switches 31 and 46 are ganged together so that inversion of only one of regions 25 and 47 can occur at a time and hence potential from only one of the sources 30 and 45 is applied to the surface adjacent region 21 at one time. When the switch 46 is closed and switch 31 is open, a high resistance channel is provided between the fifth electrode 42 and the surface adjacent region 21 and the device provides another value of capacitance to a high frequency signal in a manner to be explained below in connection with FIGS. 3 and 4.

Figure 3:
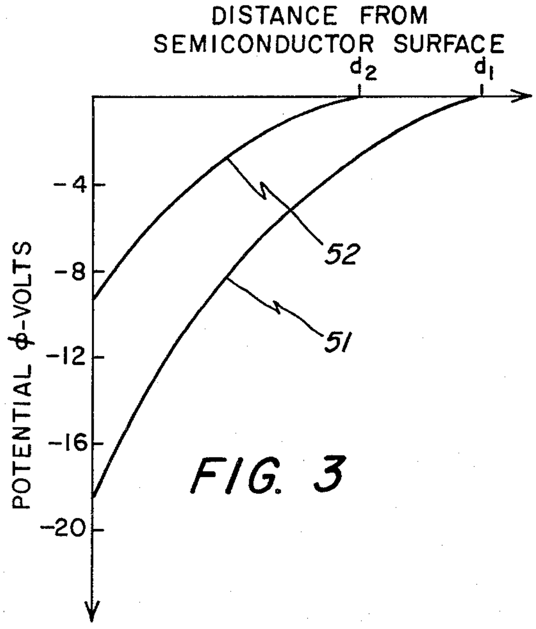

Reference is now made to FIG. 3 which shows a pair of graphs 51 and 52, each representing the distribution of potential in the semiconductor of a conductor-insulator-semiconductor (CIS) capacitor from one extreme value at the surface of the semiconductor insulatingly underlying the conductor to another extreme value at the maximum depletion depth for a given depletion producing voltage applied between the electrodes of the capacitor. The graphs in this figure are for a CIS capacitor in which the semiconductor layer is a uniform N-type conductivity of 5 ohm-cm resistivity, in which the insulation layer is 1000 Angstroms of silicon dioxide and in which the conductor or plate is constituted of molybdenum and is biased −20 volts with respect to the semiconductor layer. At this value of bias potential the CIS capacitor is biased beyond the threshold voltage (i.e. the voltage at which minority carriers generated in the semiconductor layer accumulate at the surface and invert the conductivity type of the surface adjacent region. The threshold voltage is defined more precisely as the voltage at which the conduction and valence bands of the semiconductor are bent such that the potential difference between the valence band at the surface and the bulk Fermi level is equal to the potential difference between the conduction band and the bulk Fermi level schematically indicated as line 59 in FIG. 4. The potential of the surface adjacent region 21 in relation to the bulk of the substrate layer 12 at the value of operating voltage applied between the first and second electrodes is influenced by work function effects between conductor and insulator and between the insulator and semiconductor and by the fixed charge in the insulator near the semiconductor surface. As is well known by those skilled in the art, these effects may be made small so that they account for a shift in bias of less than one volt. With a voltage of −20 volts instantaneously applied to the CIS capacitor the surface potential becomes −17.5 volts and the surface charge density is zero, the potential distribution in the depletion region is as indicated in graph from approximately −17.5 at the surface to zero at $d_1$, the distance to which the semiconductor layer is depleted of majority carriers. After a short period of the time minority carriers thermally generated in the semiconductor layer accumulate at the surface. When the charge density at the surface is $2 \times 10^{12}$ carriers (holes) per square centimeter, the potential in the depletion region varies from approximately −8 volts at the surface to zero at distance $d_2$ which is less than the distance $d_1$, as indicated in graph 52.

The portion of the device of FIG. 2 including the semiconductor layer 12, the insulating layer 14, the first and second electrodes 15 and 16 is a CIS capacitor such as described above. The potential of the surface adjacent region 21 underlying the first electrode is controlled by the potential applied to the electrode 42 as it is connected to the surface adjacent region by high resistance channel region 47. In such a structure, the capacitance appearing across the first and second electrodes is determined by the potential appearing on the fifth electrodes. The capacitance appearing across the first and second electrodes is determined by the dielectric layers between them, that is, by the insulating layer between the first electrode 15 and the surface of the semiconductor layer 12, and by the depletion region produced in the surface adjacent region 21. With the operating voltage across the first and second electrodes constant, variation of the potential applied to the third electrode from −17.5 volts to zero at a slow rate would cause the capacitance appearing across the first and second electrodes, as measured by using a small amplitude high frequency signal, to vary from a minimum value consisting of a small depletion capacitance in series with the dielectric capacitance, to a maximum value corresponding to a large depletion capacitance in series with the constant dielectric capacitance. Of course, with a bias potential of −8 V applied to the control electrode the depletion capacitance corresponding to distance $d_2$ is intermediate the extreme values of depletion capacitance and hence the extreme values of the resultant capacitance. For the condition of zero voltage applied to the control electrode the relatively large capacitance obtained by the small depletion region in series with the insulator dielectric is the equilibrium capacitance which would be obtained if no control electrode were present, and sufficient time were allowed for the surface to come to equilibrium with the bulk Fermi level. This capacitance, often referred to as $C_{min}$ because it is the lowest value obtained in the usual capacitance versus voltage plot, is not the minimum but rather the maximum value of capacitance obtained when the control electrode is operated with negative potentials.

When an alternating signal of small amplitude and low in frequency is applied between the first and second electrodes of the device 10 with a fixed potential on the third electrode, charge is cycled into and out of the surface adjacent region over the resistive channel region 20. When the frequency of the small amplitude alternating voltage signal is large in relation to the time constant of the channel region and the depletion capacitance of the surface adjacent region 21, the bias source 48 is decoupled from the surface adjacent region 21 and charge is not cycled into and out of the surface adjacent region to a significant extent, particularly if the frequency of the small amplitude alternating voltage signal is very large in relation to the aforementioned time constant. If the number of minority carriers generated in the semiconductor layer over a period of the high frequency signal is relatively small, the capacitance appearing between the first and second electrodes will be substantially constant, varying only slightly due to small changes of the capacitance versus operating voltage. The aforementioned time constant is substantially shorter than the time required for minority carriers to accumulate in the surface adjacent region upon application of the indicated potentials between the first and second electrodes in a structure not containing the channel region and the third electrode. The value of the capacitance between the first and second electrode can be changed by changing the potential applied to the fifth or control electrode or by gating in another electrode such as the third electrode 22 of FIG. 2 and gating out the sixth electrode. This would cause a change of the surface potential of the surface adjacent region in accordance with the time constant of the control circuit including the resistance of the channel region and the depletion capacitance of the surface adjacent region. This time constant would be short enough to permit change in capacitance in response to the applied control voltage to satisfy the requirements of the system in which it is to be used, for example, in television channel selection circuits it should take a fraction of a second to avoid any noticeable delay in the response of the system to a change in control voltage.

The potential of the surface adjacent region 21 underlying the first electrode is controlled by the potential applied to the third electrode 22 as it is connected to the surface adjacent region by the channel region 25. In such a structure, the capacitance appearing across the first and second electrodes is determined by the potential appearing on the third electrode. As will be pointed out in connection with FIG. 4 in connection with one aspect of the present invention, the potential applied to the third electrode is greater than a predetermined surface potential of the surface adjacent region 21 representing surface potential at maximum depletion thereof. Such a potential drains minority carriers from the surface adjacent region and maintains maximum depletion in the surface adjacent region 21 for the applied operating potential.

Figure 4:
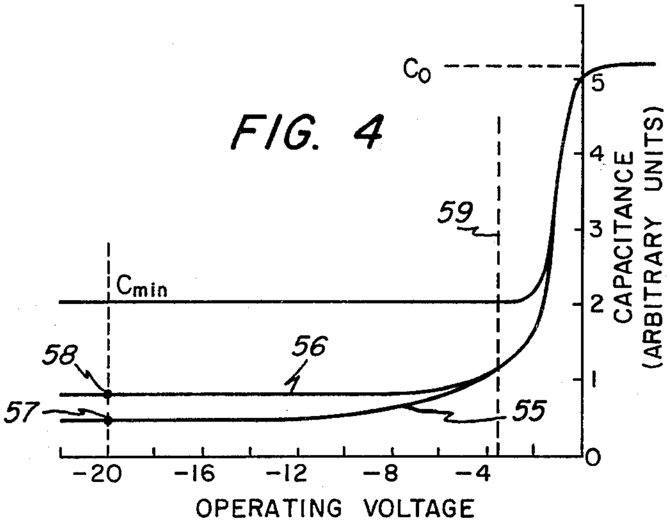

Reference is now made to FIG. 4 which shows a pair of graphs 55 and 56, each illustrating the manner in which the capacitance between the first and second electrodes of the device of FIG. 2 varies as a function of d-c operating voltage applied between the first and second electrodes for a respective capacitance control voltage applied between the second and fifth electrodes. Graph 55 shows the manner in which the capacitance varies with operating voltage when the control voltage is −17.5 and graph 56 shows the manner in which the capacitance varies with operating voltage when the control voltage is −8 volts. If the operating voltage provided by battery 35 is set at −20 volts and the control voltage from variable source 48 set at −17.5, the lowest capacitance would be represented by point 57 on graph 55 corresponding to the largest depletion width. If the control voltage is set at −8 volts the capacitance would be represented by point 58 on graph 56. As the control voltage from source 32 is further decreased toward zero, the capacitance increases until at substantially zero control voltage the capacitance is at its highest value corresponding to the $C_{min}$ equilibrium value. For a device constituted of N-type conductivity silicon semiconductor layer of $10^{15}$ net donor activator concentration corresponding to a resistivity of about 5 ohm-cms., a silicon dioxide insulating layer 1000 Angstroms thick, a first electrode having an area 250 square mils, an operating potential of −20 V applied between the first and second electrodes and a control voltage of −14 applied to the third electrode with respect to the second electrode, a capacitance of 8 picofarads is obtained. When the control voltage is changed to −8 volts a capacitance of 10 picofarads is obtained. At zero volts the capacitance approaches the equilibrium capacitance $C_{min}$ of 20 picofarads.

In the operation of the device of FIG. 2, the potential of the source 32 is set to a value greater than the potential of the surface adjacent region produced by the application of the aforementioned operating voltage between the first and second electrodes. This value of potential will maintain the surface adjacent region depleted of minority carriers and provide a capacitance characteristic represented by graph 55. While the device in principle will operate when the forementioned operating voltage is any voltage more negative that the surface inversion producing threshold voltage, in practice this voltage is set at the maximum value possible consistant with voltage breakdown and other considerations, so as to provide the maximum range of capacitance variation. The potential of the source 48 is set to a value intermediate the operating potential applied to the first electrode and second the potential of the electrode. This corresponds to a value which will provide a capaitance characteristic such as shown in graph 56. When switch 31 is closed and switch 46 is open a capacitance corresponding to point 57 on graph 55 is obtained. When switch 46 is closed and switch 31 is open a capacitance correspondi ıg to point 58 on graph 56 is obtained. High frequency signal voltages from source 38 are applied in circuit with the first set of electrodes being small in amplitude in relation to the applied operating voltage and high enough in frequency do not have an appreciable effect on the capacitance appearing between the first and second electrode of the device.

One of the capacitance controlling potentials established in the surface adjacent region 21 is a potential corresponding to a predetermined surface potential of the surface adjacent region established when an operating potential or a depletion producing potential is applied between the first and second electrodes of the device. Accordingly, one of the values of capacitance is the minimum capacitance producable in the device for a given operating potential in accordance with graph 55. As the surface adjacent region 21 under such condition of operation is depleted of conduction carriers the time constant of the surface adjacent region and the resistance of the channel region 25 in establishing such potential is not important to the operation of the device since charge carriers do not flow between the bias source and the surface adjacent region, even if this time constant is short compared to the period of the operating frequency.

Figure 5:
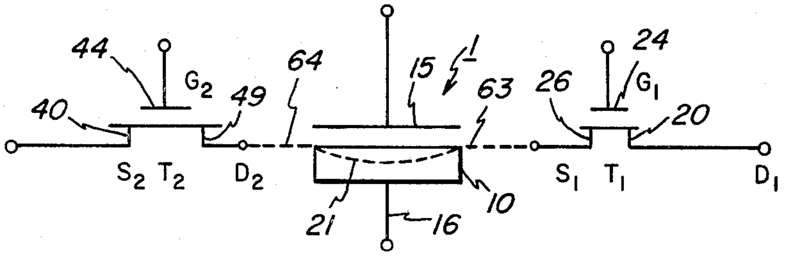
FIG. 5 shows a schematic diagram of the capacitance device of FIGS. 1 and 2.

Reference is now made to FIG. 5 which shows a schematic diagram of the device 1 described in connection with FIGS. 1 and 2. The elements of the device of FIG. 5 identical to the elements of the device of FIG. 2 are identically designated. FIG. 5 specifically shows a semiconductor device 1 having a first electrode 15 in insulated space relationship to a substrate 10 of semiconductor material to which is connected a second electrode 16. A first MOSFET transistor $T_1$ having a source $S_1$, drain $D_1$ and gate $G_1$ provided with the source $S_1$ contacting the surface adjacent region 21 of the device as indicated by dotted line 63. In this figure is also shown a second transistor $T_2$ having a source $S_2$, a drain $D_2$, and a gate $G_2$ with the drain $D_2$ contacting the surface adjacent region 21 of the device as indicated by dotted line 64. The channel region of the transistor is of high resistance as pointed out above.

Figure 6:
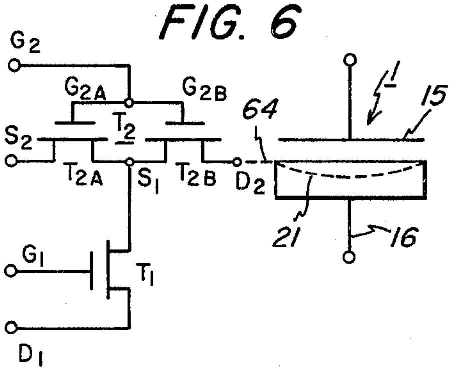
FIG. 6 shows a schematic diagram of another embodiment of a variable capacitance device.

Reference is now made to FIG. 6 which shows another schematic diagram of a semiconductor device similar to the semiconductor device 1 of FIGS. 2 and 5 in which the MOSFET transistors $T_1$ and $T_2$ of the complete device are arranged in accordance with another embodiment of the present invention to reduce the number of circuit terminals and voltages applied thereto to provide two levels of capacitance at the output terminals thereof. In the diagram of FIG. 6, elements identical to the elements of the device of FIG. 5 are identically designated. The embodiment of FIG. 6 includes a CIS capacitance device 1, a first MOSFET transistor $T_1$ having a source $S_1$, a drain $D_1$ and a gate $G_1$ and a composite second MOSFET transistor $T_2$ having a source $S_2$, a drain $D_2$ and a gate $G_2$. The composite MOSFET transistor $T_2$ is comprised of two MOSFET transistors $T_{2A}$ and $T_{2B}$, each having a source, a drain and a gate with the source to drain conduction paths of the devices connected in series. The source $S_1$ of transistor $T_1$ is connected to the junctions of $T_{2A}$ and $T_{2B}$. In this embodiment the impedance of the surface channel of transistor $T_{2A}$ is made large in relation to the impedance of the surface channel of the MOSFET transistor $T_1$. The drain electrode $D_1$ of transistor $T_1$ is connected to a potential source which would provide at the surface adjacent region 21 when the first transistor is gated "ON" a potential greater than the predetermined surface potential established thereat by the application of operating voltage between the first and second electrodes thereof. Accordingly, when a gating voltage is applied to the gate electrode $G_1$ of transistor $T_1$ to turn the transistor on, the capacitance of the device which was in its high capacitance state as set by the potential on the source $S_2$ on the transistor $T_2$ is now switched to its low capacitance state as the charge in the inversion layer of surface adjacent region 21 can drainthrough the transistor $T_{2B}$ section of the second transistor $T_2$ to the drain $D_1$ of the first transistor $T_1$. In the operation of this embodiment the second channel region of transistor $T_1$ from the surface adjacent region 21 to the second control potential applied at $S_2$ is always on and the potential of the surface adjacent region is dropped to the aforementioned predetermined surface potential whenever the first transistor is gated on. Accordingly, iι is readily apparent that only a single gating electrode $G_1$ with a single control signal is required to switch between the two capacitance states of the device 1. This embodiment simplifies the construction and operation of composite capacitance devices in which a plurality of such devices are utilized to provide a plurality of discrete values of capacitance from a minimum to a maximum value. The device has other advantages such as enabling the capacitance states of the device to be essentially instantaneously established by the application or removal of gating voltage to the first transistor.

Figure 7:
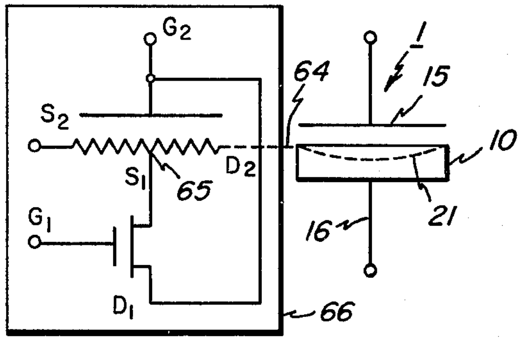
FIG. 7 shows another schematic diagram of the embodiment of FIG. 6 which readily lends itself to physical implementation.
Figure 8:
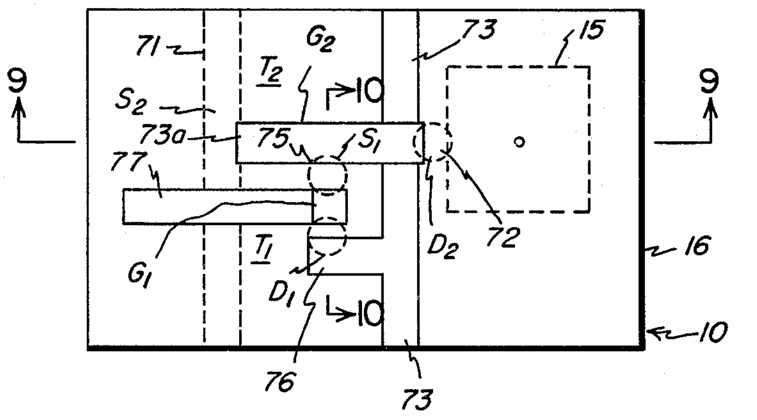
FIG. 8 represents a physical implementation of the embodiment shown in schematic diagram form in FIG. 7.
Figure 9:
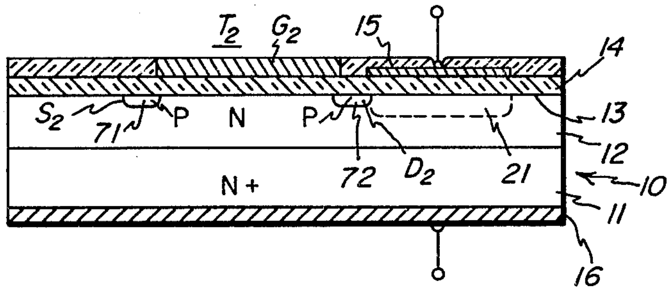
FIG. 9 is a sectional view of the embodiment of FIG. 8 taken along section lines 9—9 thereof.
Figure 10:
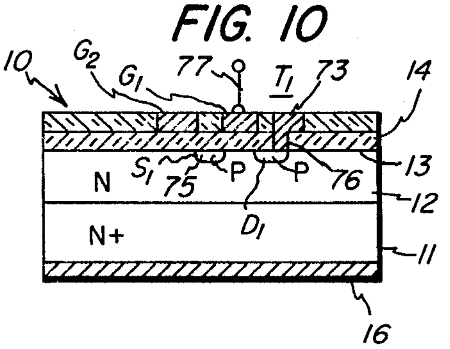
FIG. 10 is a sectional view of FIG. 8 taken along section lines 10—10 thereof.
Figure 11:
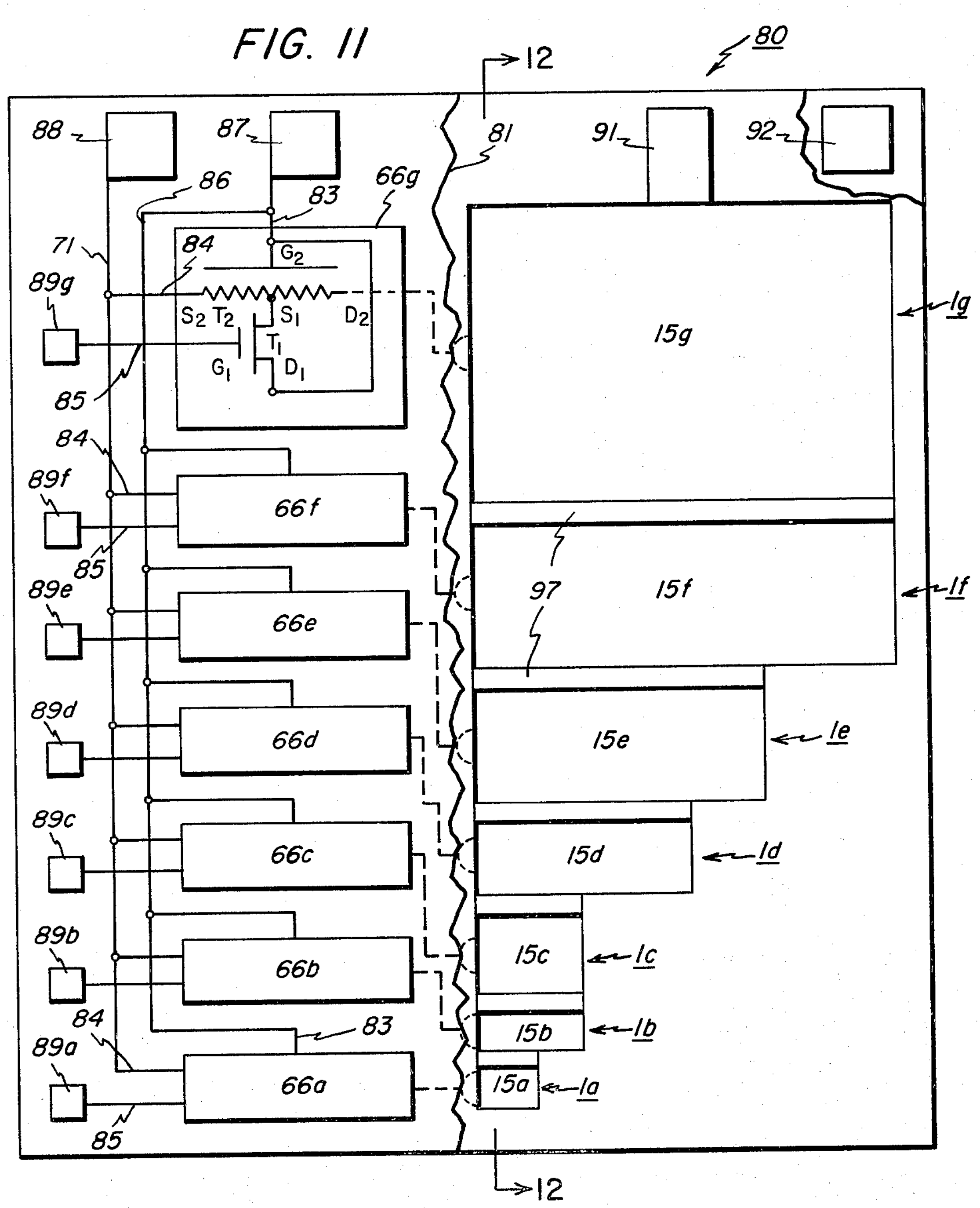
FIG. 11 shows a diagram of another embodiment of the present invention including a plurality of semiconductor devices formed on a common substrate, each device having a construction such as shown in FIG. 8.

Reference is now made to FIG. 7 which shows the embodiment of FIG. 6 with certain modifications permitting ready implementation in physical form and utilization in a composite device such as shown in FIG. 11. The particular physical implementation of the embodiment of FIG. 7 is shown in FIGS. 8, 9 and 10. The first transistor $T_1$ of FIG. 7 is identical to the first transistor of FIG. 6 and is identically symbolized. The second transistor $T_2$ of FIG. 7 is identical to the second transistor $T_2$ of FIg. 6, but differently symbolized. The drain $D_2$ of the second transistor is connected to the surface adjacent region 21 of the CIS capacitance device 1. The source $S_1$ of the first transistor is connected to an intermediate point 65 of the channel region of the second transistor $T_2$. The drain electrode $D_1$ of the first transistor is connected to the gate electrode $G_2$ of the second transistor device. The control circuit of FIG. 7 including transistor devices $T_1$ and $T_2$ may be conveniently referenced by block 66 enclosing the circuit. As in the embodiment of FIG. 6 the second transistor $T_2$ is always maintained in the "ON" condition by applying a large inversion producing voltage to the gate $G_2$ of the second transistor device. Such voltage would preferably be equal to or of greater magnitude than that which provides the predetermined surface potential appearing in the surface adjacent region 21 for the operating voltage used on the first electrode with respect to the second electrode of device 1, as explained above. Of course, the impedance of the section of the channel region of the second transistor $T_2$ adjacent the source $S_2$ is made much larger than the impedance of the channel region of the first transistor $T_1$ so that the potential of the intermediate point 65 of the channel region of the second transistor $T_2$ is sufficiently lower than the aforementioned predetermined surface potential in the surface adjacent regions 21 of the devices to drain charge carriers therefrom and establish the low capacitance states of the devices. Thus, by simply applying or not applying a gating voltage to the gate $G_1$ of the first transistor, the surface potential of the surface adjacent region 21 may be shifted from a high capacitance value determined by the potential of source $S_2$ of the second transistor to a low capacitance value determined by the operating potential applied between the first electrode 15 and the second electrodes 16 of the CIS device. Of course the device may be operated with the voltage applied to $D_1$ at a less negative potential. This condition of operation, however, would normally be less desireable in that variations of the intermediate voltage at $S_1$ would influence the minimum or low capacitance value of that section of the composite device. On the other hand, when it is desireable to operate the device with surface charge present in both capacitance states, the voltage of $D_1$ may be set less negative than that voltage which produces below the gate electrode of $T_2$ a potential equal to that provided by the operating potential in region 21.

Reference is now made to FIGS. 8, 9 and 10 which show a physical embodiment of the circuit configuration of FIG. 7. The elements of FIG. 8, which are identical to the elements of FIG. 7, are identically designated. The physical embodiment of FIGS. 8, 9 and 10 will be useful in the provision of a composite device including a plurality of such devices, such as will be more particularly shown and described in connection with FIG. 11. The various electrodes of the device of FIGS. 8, 9 and 10 are organized to facilitate interconnection of corresponding electrodes of the devices of the composite structure. In the embodiment of FIG. 8, there is shown the CIS capacitor 1 including the first capacitance providing electrode 15 in insulated relationship to substrate 10 to which the second electrode 16 is connected. There is also shown a second MOSFET transistor $T_2$ including a source $S_2$, a gate $G_2$ and a drain $D_2$. The source and drain are in the form of P-type regions 71 and 72 in the semiconductor layer and the gate $G_2$ is in the form of a large horizontal section 73*a* of conductive member 73 insulatingly spaced with respect to the substrate by a relatively thin region of insulation between the P-type regions 71 and 72. The vertical section of conductive member 73 which overlies a thicker insulating layer connects the drain $D_1$ to gate $G_2$ and allows connection to corresponding elements of adjacent devices. The source of the transistor $T_2$ is in the form of a section of a elongated P-type region 71 extending down the length of the substrate and allows interconnection with the source regions of the second MOSFET transistor devices of a composite device in which such region would be designated as the second control electrode. The drain $D_2$ of the second MOSFET transistor is connected to the surface adjacent region 21. There is also provided a first MOSFET transistor including a source $S_1$, a drain $D_1$ and a gate $G_2$. The source $S_1$ in the form of a P-type region 75 contacts the channel region of the second MOSFET transistor $T_2$. The drain electrode $D_1$ is connected by means of the conductive member 76 in a hole in the layer 14 to the metallization run or conductive member 73 which interconnects the drain $D_1$ of the first MOSFET transistor with the gate $G_2$ of the second MOSFET transistor and also enables the corresponding electrodes of adjacent devices in a composite device to be interconnected. The gate electrode $G_1$ of the first transistor is connected to a conductive line 77 which may be terminated on the side of the device to a suitable terminal to which gating voltages may be applied. Accordingly, it is readily apparent from the embodiment of FIG. 8 that a plurality of devices such as shown may be arranged in sequence to provide a composite device in which the second control electrodes represented by P-region 71 are readily connected in common, in which the drain electrodes $D_1$ of the first transistors may be connected together along the metallization run 73 and in which the capacitance state of the devices is controlled by the control voltages applied to the control gate conductive lines 77 thereof. The foregoing advantages of the structure of FIG. 8 will be readily apparent from a consideration of the embodiment of FIG. 11 to which reference is now made.

FIG. 11 shows a plan view of a composite device 80 providing a capacitance for a high frequency signal variable in discrete increments from a minimum value to a maximum value in response to digital control signals applied to the gating electrodes thereof. Each of the devices of FIG. 8 which form the composite device are identical in form to the device of FIGS. 8–10. The devices are seven in number and are similarly designated along with the elements thereof by identical numerical designations to the designations used in FIGS. 8–10 followed by differentiating literal subscripts.

In FIG. 11 the right hand portion of the diagram shows the capacitance providing electrodes 15*a*–15*g* of a composite device 80 overlying the semiconductor substrate 10 and to the left of the broken line 81 is shown a schematic representation for the control circuits 66*a*–66*g* for each of the capacitance devices 1*a*–1*g* for controlling the capacitance thereof. Each of the individual capacitance devices 1*a*–1*g* has respective one of capacitance controlling circuits 66*a*–66*g*, identical to the capacitance controlling circuit 66 illustrated in the schematic diagram of FIG. 7 and also shown in FIGS. 8, 9 and 10. Only control block 66*g* of blocks 66*a*–66*g* shows the schematic diagram of the circuit. Each of the blocks 66*a*–66*g* has three conductive lines 83–85 extending therefrom. One line 83 is connected to the first drain and the second gate of the transistor devices. Another line 84 is connected to the source $S_2$ of the second transistor device. A further line 85 is connected to the gate $G_1$ of the first transistor. The first drains of all of the devices are interconnected by the conductive line 86 representing the metallization run 73 and to a terminal 87. The sources $S_2$ of the second transistor are connected by the elongated P-type region 71 to terminal 88. The gates $G_1$ of the first transistor devices of blocks 66*a*–66*g* are connected over a respective one of lines 85 to a respective one of gating terminals 89*a*–89*g*. Each of the drains of the second transistor are connected to respective surface adjacent regions $21a$–$21g$ underlying a respective one of CIS capacitance devices 1$a$–1$g$. The terminal 91 is connected to the first electrodes 15$a$–15$g$ of the individual capacitance devices and the terminal 92 is connected to the second or common electrodes 16 of the individual devices.

Figure 12:
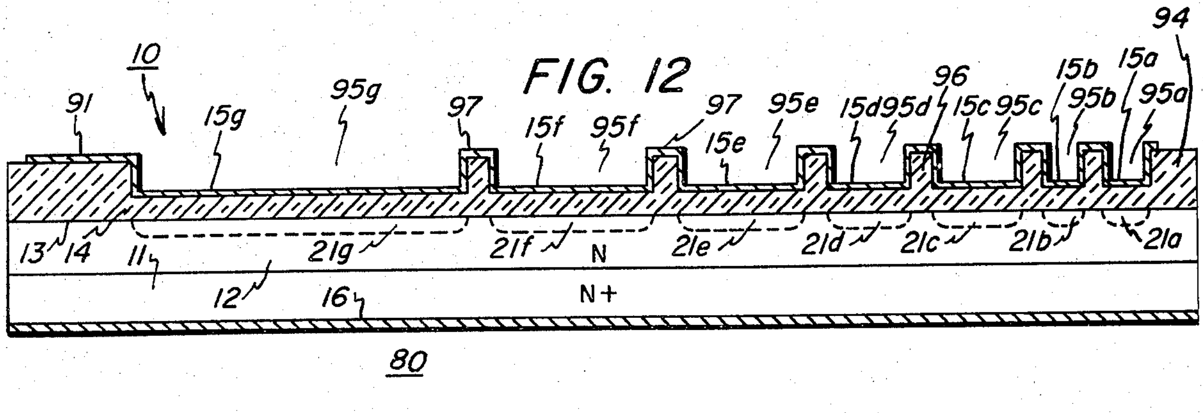
FIG. 12 is a sectional view of FIG. 11 taken along section lines 12—12 thereof.

The structure of the composite capacitance device to the right of the broken line 81 of FIG. 11 will now be described in connection with FIG. 12. The device 80 includes a body of semiconductor material 10 of one conductivity type, such as N type silicon, for example, conveniently the body may be constituted of a substrate layer of low resistivity epitaxially grown thereon and providing exposed major face or surface 13. Conveniently the layer 11 may be 15 mils thick and the epitaxial layer 12 may be 10 microns thick. A thick layer 94 of a suitable insulating material such as silicon dioxide, for example, 15,000 Angstroms thick, is formed and on the major exposed face 13 of the epitaxial layer. The thick layer of insulation is provided with a plurality of recesses 95$a$–95$g$ spaced from the semiconductor surface 13 by a thin layer 14 of silicon dioxide, for example 1000 Angstroms thick. The recesses are separated from one another by portions of thick oxide 96. The recesses have areas corresponding to the desired relationship of the areas of the first electrodes 15$a$–15$g$ of the semiconductor devices, as will be explained below. A conductive film, for example molybdenum, is formed over the thin portions of the insulating material to provide various electrodes 15$a$ thru 15$g$ for the device including the interconnections 97 therebetween over the thick oxide portions 96 and the common capacitance providing electrode terminal 91. A terminal 92 is connected to conductive member 16 conductively connected to the opposite face of the substrate 10 and constitutes the common terminal of the devices. The areas of the capacitance providing electrode or first electrode of each of the devices 1$a$–1$g$ is different and ranges from an area of minimum value to one having an area of maximum value. The first electrodes 15$a$–15$g$, having areas designated respectively $A_1$ thru $A_7$, are successively arranged so that the area of each successively larger first electrode is approximately twice the area of the preceding first electrode.

The manner in which the combination of the high and low level capacitances of the devices of composite device 80 may be utilized to provide a plurality of values of capacitance from a minimum value corresponding to the sum of the low value capacitances of the capacitors when a first potential is established in all of the surface adjacent regions of the capacitors to a maximum value corresponding to the sum of the high value capacitances of the capacitors when a second potential lower in magnitude than the first potential is established in all of the surface adjacent regions of the capacitors will now be described. The minimum or lowest capacitance across the output terminals of the composite device denoted $C_{low}$ may be represented by the following equation:

$$C_{low} = C_1(A_1+A_2+A_3+A_4+A_5+A_6+A_7). \quad (1)$$

Also, the maximum or highest capacitance denoted $C_{high}$ may be represented as follows:

$$C_{high} = C_2\ (A_1+A_2+A_3+A_4+A_5+A_6+A_7), \quad (2)$$

where $C_1$ is the capacitance per unit area of a device in the low capacitance state, where $C_2$ is the capacitance per unit area of a device in its high capacitance state and where $A_1$ through $A_7$ represent, respectively, the areas of the seven first electrodes arranged in sequence from the smallest to the largest in area. Subtracting equation 1 from equation 2 the following relationship is obtained:

$$C_{high} - C_{low} = (C_2 - C_1)\ (A_1+A_2+A_3+A_4+A_5+A_6+A_7) \quad (3)$$

From equation 3 it is readily apparent that the total capacitance $C_t$ across the output terminals of the composite capacitor may be represented by the following relationship:

$$C_t = C_{low} + \Delta C \times A_t, \quad (4)$$

where $\Delta C$ is $C_2$–$C_1$, the differential capacitance between the high capacitance state and the low capacitance state per unit area of any one of the semiconductor devices, where $C_{low}$ is the minimum or lowest capacitance of the composite device and where $A_t$ is equal to the total area of the first electrodes of the individual capacitor devices operating in the high capacitance state. As each successively larger area is twice the preceding area, the areas may be represented by the series 1, 2, 4, 8, 16, 32 and 64. It is readily apparent that the numbers in the above series may be combined to provide numbers in consecutive order from 1 through 127 and accordingly provide a variation in total capacitance in equal increments each increment being represented by $C \times A_1$. For example, to provide a value of capacitance which is located 11 increments or steps above the minimum capacitance of the composite device, the devices 1$a$, 1$b$ and 1$d$ would be put in their high capacitance state. As the areas of the first electrodes of devices 1$a$, 1$b$ and 1$d$ have a combined weight or sum of 11, the value capacitance obtained would be the minimum capacitance of the composite device plus 11 × the incremental capacitance represented by $\Delta C \times A_1$. The foregoing analysis disregarded slight variations of capacitance of the device from idealized value due to edge capacitance effect. If it is desired to take edge capacitance effect into account, the areas of the first electrodes 15$a$–15$g$ may be adjusted slightly so that the capacitance provided by each successive first electrode is twice the capacitance provided by the preceding first electrode.

Accordingly, it is seen that in FIG. 11 a composite semiconductor variable capacitance device 80 is provided in which the capacitance thereof is variable in equal increments from a minimum value to a maximum value through a total of 127 steps. To provide such a device a total of only 14 terminals are required, i.e., $N+4$ terminals, where $N$ represents the number of individual devices in the composite device.

Figure 14:
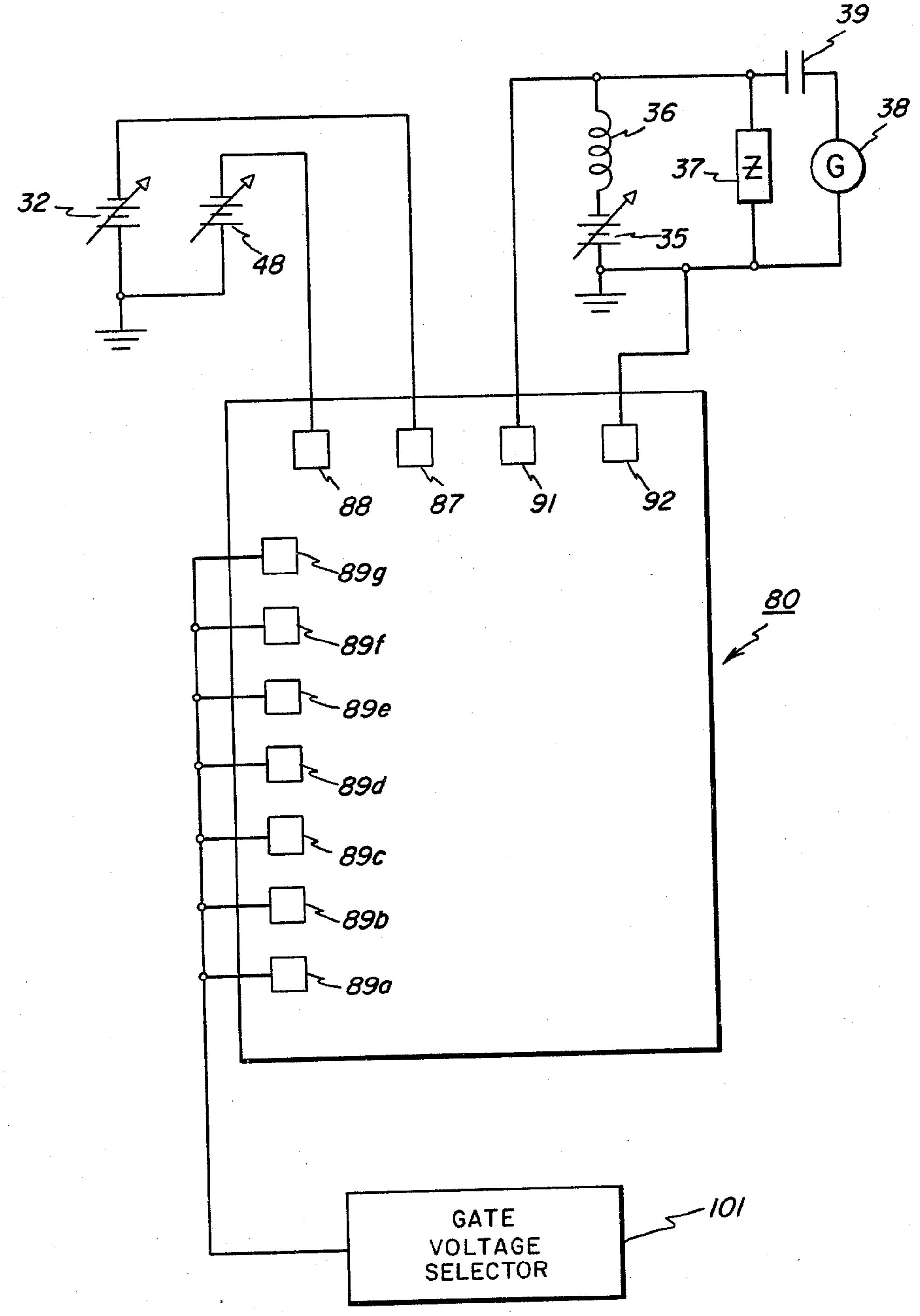
FIG. 14 shows a block diagram of a system in which the semiconductor apparatus or composite semiconductor device of FIG. 11 is incorporated to provide a plurality of discrete values of capacitance in response to preset control signals applied thereto.

In the operation of the composite device of FIG. 11 in apparatus such as disclosed and shown in FIG. 14, it is important that source 48 connected to the high capacitance determining terminal 88 provide constant voltage and preferably have a low internal impedance so that once a desired value of voltage is set, it remains set. It is important for voltage of source 48 to be stable as it determines the high value of capacitance of the devices of the composite device. It is also important that the P region 71 and its electrical connection to capacitance determining terminal 88 which serves as a control electrode of the devices be configured in such a way so as to avoid any significant voltage drop which may vary the high capacitance determining voltage applied to the various devices of the composite device. To this end, a high conductivity metallic strip may be employed in place of a portion of the P type region 71 to provide a common interconnection and to assure good conduction therealong. In the alternative, the sources of the second transistors $T_2$ may be connected individually to terminal 88. In the first alternative the conductive lines 85 which are connected to gates G1 may conveniently be formed by P diffused regions. This provides isolation at the crossings of lines 71 and 85.

Figure 13:
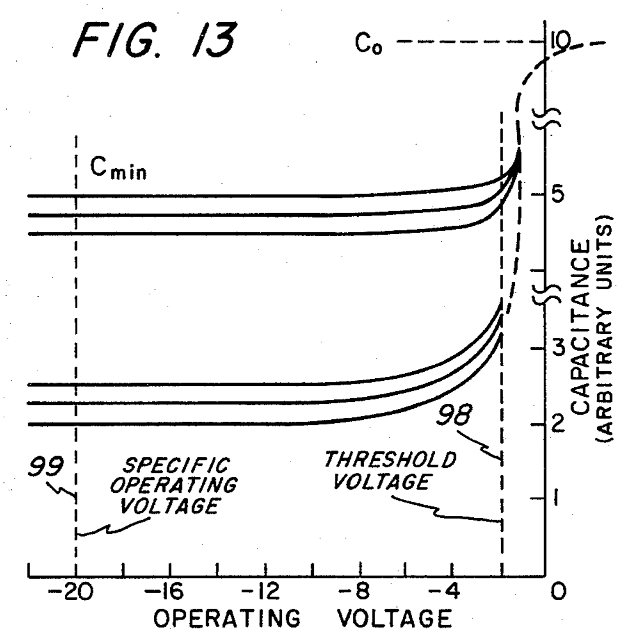
FIG. 13 shows a plurality of graphs each illustrating the manner in which the capacitance between the capacitance providing electrodes of the composite semiconductor device of FIG. 11 varies as a function of d-c operating voltage applied therebetween for respective sets of control voltages applied to the controlled electrodes of the composite device of FIG. 11.

Reference is now made to FIG. 13 which shows a plurality of graphs of capacitance vs operating voltage for the composite device of FIG. 11, each graph corresponding to unique combination of capacitance conditions of the individual capacitance devices of the composite capacitance device 80. The graphs are analogous to the graphs of FIG. 4. FIG. 13 shows the threshold voltage 98 of the composite device and a suitable operating voltage 99 therefor. The device 80 has a total of 127 graphs, however for reasons of simplicity and clarity only the graph of the lowest capacitance denoted $C_{low}$ and the graph of the highest capacitance denoted $C_{high}$ and several graphs displaced therefrom by equal increments ($\Delta C \times A_1$) are shown.

Reference is now made to FIG. 14 which shows the composite device 80 of FIG. 8 in block form connected in circuit with other apparatus for illustrating the manner in which the capacitance of the composite device may be continuously varied in discrete steps to provide any one of a plurality of discrete values between a minimum and a maximum value in response to suitable control signals. Operating voltage is applied to the composite device by variable voltage battery 35 having its positive terminal connected to the common or second electrode terminal 92 and having its negative terminal connected through a high frequency choke 36 to the first electrode terminal 91. An impedance 37 which may be an inductance, is connected in shunt across the first and second electrode terminals 91 and 92 to form a resonant circuit with the capacitance presented thereby. A source of high frequency energy 38 is also connected between the first and second electrode terminals. Voltage for setting the high capacitance state of each of the devices is provided by variable voltage source 48, the positive terminal of which is connected to ground and the second electrode and the negative terminal of which is connected to the fifth electrode terminal 88. The voltage of source 48 may be varied to vary the high capacitance states of the individual devices of the composite device 80 and hence the high value of the capacitance of the device 80. To obtain maximum capacitance the source 48 may be eliminated and terminal 87 connected to ground. Voltage source 32 having its positive terminal connected to the second electrode terminal 92 and its negative terminal connected to the third electrode terminal 87 provides the voltage for determining the low capacitance state of each of the individual devices.

The gating terminals *89a–89g* of the device 80 are connected to a gate voltage selector 101. The selector may be a 128 position switch which provides a unique combination of gating voltages to the gating terminals for each position of the switch corresponding to a unique value of capacitance of device 80. As mentioned above, the presence of a gating voltage on a gating terminal of a device produces one value of capacitance and the absence of a gating voltage produces another value of capacitance in the individual device. The function of the gate voltage selector switch may be provided by a Read-Only Memory addressable by suitably coded signals to provide digital coded outputs, each corresponding to a respective unique value of capacitance of device 80. When the composite device is operated in the fully depleted mode, the minimum capacitance of the composite device 80 is set by setting the operating voltage applied between the first and second electrodes 91 and 92 of the composite device. In this connection use is made of the fact that the capacitance versus operating voltage characteristic has a small slope, i.e., the low value of capacitance decreases at a low rate with increasing operating voltage. The maximum capacitance of the composite device is set by setting the voltage applied to the control electrode terminal 88. With such adjustments for a given operating voltage applied between the first and second electrode terminals 91 and 92, the increment of capacitance ($\Delta C \times A_1$) between successive values of capacitance is precisely set assuming that the first electrodes were formed having areas arranged in the series described above.

If desired, to provide automatic frequency control, the operating voltage can be used to provide the small capacitance variations which are desired. The control voltage applied to terminal 88 may also be utilized for this purpose. When the capacitor is operated in the non fully depleted mode electrode 87 may also be employed to this end. The composite device 80 is thus useable to provide automatic frequency control in television systems.

The circuit consisting of the capacitance of composite device 80 and the impedance 37 may constitute a resonant circuit useable in the preamplifier and local oscillator stages of television receivers for channel selection. In such applications, several such composite capacitors may be used in different tuned circuits, and controlled, as desired, from a common gate voltage selector or different gate voltage selectors.

Figure 17:
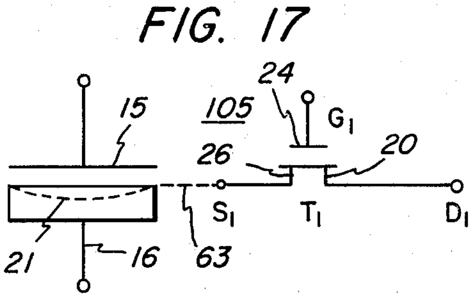
FIG. 17 is a schematic diagram of the device of FIGS. 15 and 16.
Figure 15:
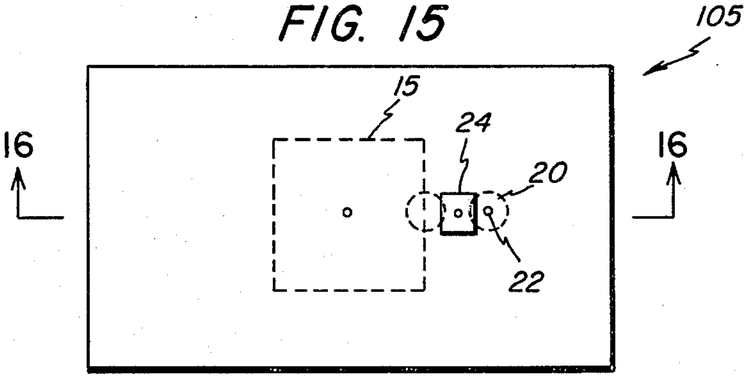
FIG. 15 shows a plan view of a semiconductor device including a single means for controlling the capacitance thereof to provide both a low value and a high value of capacitance.
Figure 16:
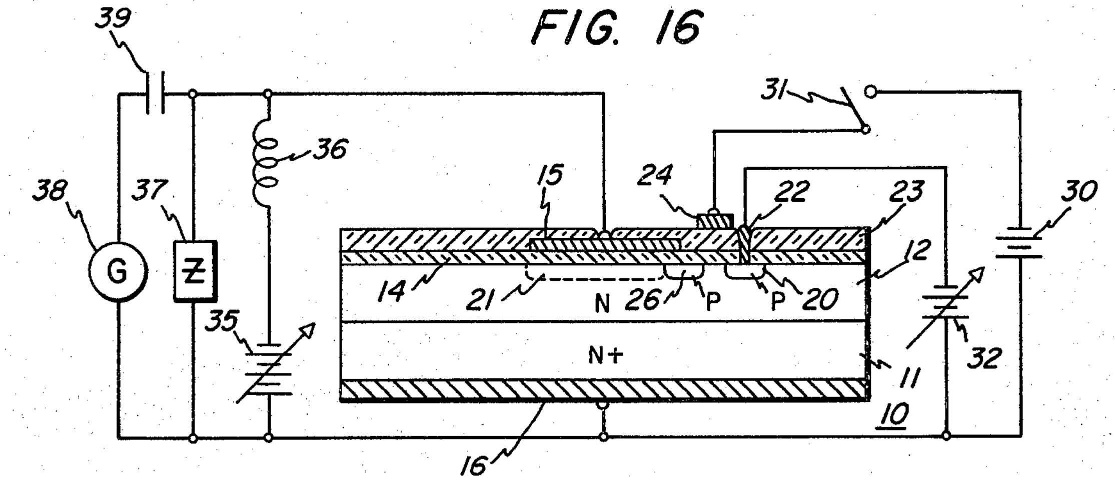
FIG. 16 shows a front elevation view of the semiconductor device of FIG. 15 taken along section lines 16—16 thereof including circuits for the operation thereof.

Reference is now made to FIGS. 15, 16 and 17 which show a semiconductor variable capacitance device 105 similar to the variable capacitance device 1 of FIGS. 1, 2, and 5 in which the means for establishing the high capacitance state of the device and the circuit connections thereof are eliminated. In these figures, the elements corresponding to identical elements of FIGS. 1, 2 and 5 are identically designated. FIG. 17 shows a schematic diagram of the capacitance device 105 of FIGS. 15 and 16 including a first electrode 15, a second electrode 16, a substrate 10 and a surface adjacent channel 63, and a MOSFET transistor $T_1$ including a source $S_1$, a drain $D_1$ and a gate $G_1$ in which the source is connected as represented by dotted line 63 to the surface adjacent region 21 of the device. The low capacitance state of the device is established as in the device 1 by applying gating voltage to transistor $T_1$. The high capacitance state of the device 105 is established by allowing normal charge carrier generation processes (thermal for example) to establish an inversion layer in the surface adjacent region 21 to establish the high capacitance state corresponding to the $C_{min}$graph of FIG. 4. The structure of FIGS. 15 and 16 eliminates the need for a second transistor $T_2$. The dynamic characteristics of the device 105 are less satisfactory than the device of FIGS. 6 and 7 in that time is required for high capacitance state to be established in the device due to the finite time required for generation of carriers in the substrate and the accumulation thereof in the inversion layer in the surface adjacent region 21 to establish the high capacitance state. In the device of FIGS. 6 and 7 as soon as gate voltage is removed from the first transistor charge carriers are supplied to the surface adjacent region of the CIS device to establish the high capacitance state as the second transistor $T_2$ is always on and is connected to a potential source. A plurality of devices such as shown in FIGS. 15 and 16 may be used to form a composite device such as shown in FIG. 11.

While the various capacitance devices in accordance with the present invention have been shown in operative association with various circuits, it is to be understood that the circuits are shown as illustrative and are not to be construed as limiting the manner in which the devices may be used.

While in the illustrative embodiments described, the semiconductor material utilized is silicon, other semiconductor materials such as germanium and Group III-Group V compounds, such as gallium arsenide, could be used. Also, while in the illustrative embodiments described the insulating member was constituted of silicon dioxide, other insulating materials such as silicon nitride, silicon oxynitride, and aluminum oxide would be suitable. Also, the conductive plates could be constituted of any of a number of conductive materials, metallic and non-metallic such as molybdenum, tungsten, aluminum and polycrystalline silicon. In general, however, these electrodes require high conductivity so that high Q circuits may be obtained. For applications where Q is of less importance lower conductivity materials may be used.

While in the various embodiments shown and described, and N-type conductivity semiconductor substrate material was specified, P-type conductivity semiconductor material could as well be used. Of course, in such a case the applied potentials would be reversed in polarity. In choosing the desired substrate conductivity type considerations of low series resistance between the first and second electrodes of the devices is important. For this reason, when the semiconductor material is silicon, an N-type substrate is preferred.

While the body of semiconductor material utilized in the devices have been shown as constituted of a strongly N-type conductivity substrate of low resistivity and an epitaxial layer of high resistivity thereon of the desired net activator concentration or resistivity, the substrate layer could be dispensed with and low resistance connection made directly to the high resistivity layer. However, the substrate layer provides a convenient starting point for forming thin high resistivity layers thereon and also for making low resistance connection thereto to provide low series resistance and hence high Q in the variable capacitance device.

The various techniques utilized in the fabrication or formation of devices including epitaxially growing silicon layers on silicon, thermally growing silicon dioxide on silicon, forming apertures in silicon dioxide layers by photolithographic masking and etching, implantating and diffusing activators through apertures in silicon dioxide masking layers into an underlying semiconductor layer to form regions of desired conductivity type, geometry and electrical characteristics. metallizing of regions to form desired electrical connection paths and the like are all well known to those skilled in the art. Utilizing such techniques it is readily apparent to one skilled in the various ways in which the devices of the present invention may be fabricated.

Accordingly, while the invention has been described in specific embodiments it will be appreciated that modifications may be made by those skilled in the art and it is intended by the appended claims to cover all such modifications and changes as fall within the true spirit and scope of the invention.

What I claim as new and desire to secure by Letters Patent of the United States is:

1. Semiconductor apparatus for providing a capacitance for a high frequency signal variable in discrete increments comprising a substrate of semiconductor material of one type conductivity, a plurality of capacitance providing electrodes, each insulatingly overlying and spaced a predetermined distance from a respective surface adjacent region of said substrate and forming with respect to a common electrode connected to said substrate a respective capacitor, said capacitance providing electrodes being connected together to provide a common capacitance providing electrode of said apparatus, means for applying a depletion producing voltage between said common capacitance providing electrode and said common electrode corresponding to a predetermined surface potential of said surface adjacent regions, said predetermined surface potential having an absolute value less than the absolute value of said depletion producing voltage and greater than the inversion threshold surface potential of said capacitors, means for applying a high frequency signal between said common capacitance providing electrode and said common electrode, control means for establishing individually in each of said surface adjacent regions a first potential in relation to said substrate corresponding to a respective low value of capacitance between a respective capacitance providing electrode and said common electrode, and for establishing alternatively and individually in each of said surface adjacent regions a second potential in relation to said substrate corresponding to a respective high value of capacitance between a respective capacitance providing electrode and said common electrode, said control means including a first control electrode, channel establishing means for individually establishing a plurality of first channel regions of opposite type conductivity in said substrate, each first channel region connected between a respective surface adjacent region and said first control electrode, and means for applying a first control potential to said first control electrode greater in magnitude than said predetermined surface potential whereby each surface adjacent region is drained of charge carries therein when a respective first channel is established, whereby the capacitance of said device is variable in increments dependent on the particular potentials established in the surface adjacent regions of the capacitors from a minimum value corresponding to the sum of the low value capacitances of the capacitors when said first potential is established in all of the surface adjacent regions of said capacitors to a maximum value corresponding to the sum of the high value capacitances of the capacitors when said second potential is established in all of said surface adjacent regions of said capacitors.

2. The combination of claim 1 in which said channel establishing means comprises a plurality of first gate electordes, each spaced in insulated relationship to said substrate to provide a respective first channel region when energized, means for individually energizing each of said first gate electrodes.

3. The combination of claim 1 in which is provided a second control electrode and means for producing a plurality of second channel regions of opposite conductivity in said substrate, each connected between said second control electrode and a respective surface adjacent region, the time constant of the capacitance of each of said surface adjacent regions and the resistance of the second channel region connected thereto from said second electrode being large in relation to a period of said high frequency signal, means for applying a potential to said second control electrode which establishes said second potential in each of said surface adjacent regions when a respective second channel region is established.

4. The combination of claim 1 in which is provided a second control electrode and means for producing a plurality of second channel regions of opposite conductivity in said substrate, each connected between said second control electrode and a respective surface adjacent region, the time constant of the capacitance of each of said surface adjacent regions and the resistance of the second channel region connected thereto from said second electrode being large in relation to a period of said high frequency signal, means for providing a potential to said first control electrode greater than said predetermined surface potential of said capacitors and for providing said second potential to said second control electrode, means for alternatively establishing the first channel region connected to each of said surface adjacent regions.

5. The combination of claim 4 in which the end of each of said first channel regions remote from said first electrode are connected to a respective second channel region.

6. The combination of claim 5 in which the impedance of each of the established second channel regions between said second electrode and point of connection of a respective first channel region thereto is large in relation to the impedance of said respective first channel region whereby when of each said first channel regions are established a potential greater than said predetermined surface potential is applied to the surface adjacent region of a respective capacitor.

7. The combination of claim 4 in which said second potential is substantially the potential of said substrate.

8. The combination of claim 4 in which the end of each of said first channel regions remote from said first electrode are connected between the ends of a respective second channel region.

9. The combination of claim 4 in which each of said first channel regions is the channel of a respective MOSFET transistor formed in said substrate and including a source, a drain and a gate electrode with each source connected to a respective surface adjacent region and each drain connected to said first control electrode, and means for energizing each of said gate electrodes for establishing a channel in a respective transistor.

10. The combination of claim 4 in which each of said first channel regions is the channel of a respective first MOSFET transistor formed in said substrate and including a first source electrode, a first drain electrode and a first gate electrode and in which each of said second channel regions is the channel of a respective second MOSFET transistor formed in said substrate and including a second source electrode, a second drain electrode, and a second gate electrode, each of said second source electrodes being connected to said second control electrode, each of said second drain electrodes being connected to a respective surface adjacent region, each of said first source electrodes connected to a point on the channel of a respective second MOSFET transistor intermediate the ends thereof, each of said second drain electrodes connected to a respective second gate electrode and a potential greater than said predetermined surface potential of said capacitors, and means for energizing each of said first gate electrodes for establishing a channel in a respective transistor.

11. A semiconductor device for providing a pair of discrete values of capacitance for a high frequency signal comprising a body of semiconductor material of one type conductivity, a first conductive member insulatingly overlying a surface adjacent region of said body, a second conductive member in electrical contact with another region of said device, means for applying a depletion producing voltage between said first and second conductive members corresponding to a predetermined surface potential of said surface adjacent region, said predetermined surface potential having an absolute value less than said depletion producing voltage but greater than the inversion threshold voltage of said device, a first control electrode for controlling the capacitance between said first and second conductive members, means for applying a first control potential to said first control electrode greater in magnitude than said predetermined surface potential, a first biasing means for selectively providing a first channel region of opposite type conductivity between said first control electrode and said first surface adjacent region, a second control electrode for controlling the capacitance between said first and second conductive members, a second biasing means for selectively establishing a second channel region of opposite type conductivity connected between said second control electrode and said surface adjacent region, the time constant of the capacitance of said surface adjacent region and the resistance of said second channel region being large in relation to a period of said high frequency signal, means for alternatley rendering operative said first and second biasing means to establish one or the other of said discrete values of capacitance.

12. The combination of claim 11 in which said first biasing means includes a pair of activator induced surface adjacent regions of opposite conductivity type spaced apart to form a surface channel therebetween, one of said pair of regions of opposite conductivity type contacting said first surface adjacent region and the other of said pair of regions of opposite conductivity type connected to a source of bias potential providing a potential greater than said predetermined surface potential, and voltage means for rendering said surface channel opposite in conductivity type to said one conductivity type thereby lowering the potential of said surface adjacent region to a value below said predetermined surface potential.

13. The combination of claim 12 in which said first channel region and said second channel region are connected to a common portion of said surface adjacent region.

14. The combination of claim 13 in which the impedance of said first channel region is substantially greater than the impedance of said second channel region.

15. The combination of claim 14 in which said first channel region is continuously maintained and in which said second channel is selectively established.

16. The combination of claim 15 in which said second channel region includes a high impedance portion and a low impedance portion and in which said first channel region is connected to the juncture of said portions.

17. A semiconductor device for providing a pair of discrete values of capacitance for a high frequency signal comprising a body of semiconductor material of one type conductivity, a first conductive member insulatingly overlying a surface adjacent region of said body, a second conductive member in electrical contact with another region of said device, means for applying a depletion producing voltage between said first and second conductive members to a predetermined surface, potential of said corresponding surface adjacent region, said predetermined surface potential having an absolute value less than the absolute value of said depletion producing voltage and greater than the inversion threshold voltage of said device, a first biasing means for selectively applying a voltage to said first surface adjacent region greater than said predetermined surface potential, whereby when said voltage is applied to said first surface adjacent region the capacitance between said first and second conductive members has one of said pair of values and when no voltage is applied an inversion layer is established in said surface adjacent region and the capacitance between said first and second conductive members has another value greater than said one value.

18. The combination of claim 16 in which said first biasing means includes a pair of activator induced surface adjacent regions of opposite conductivity type spaced apart to form a surface channel therebetween, one of said pair of regions of opposite conductivity type contacting said surface adjacent region and the other of said pair of regions of opposite conductivity type connected to a source of bias potential providing a potential greater than said predetermined surface potential, and voltage means for rendering said surface channel opposite in conductivity type to said one conductivity type thereby lowering the potential of said surface adjacent region to a value below said predetermined surface potential.

* * * * *